US012640211B2

(12) United States Patent
He et al.

(10) Patent No.: US 12,640,211 B2
(45) Date of Patent: May 26, 2026

(54) READ DISTURB DETECTION IN A MEMORY SYSTEM

(71) Applicant: Micron Technology, Inc., Boise, ID (US)

(72) Inventors: Deping He, Boise, ID (US); Chun Sum Yeung, San Jose, CA (US)

(73) Assignee: Micron Technology, Inc., Bosie, ID (US)

( * ) Notice: Subject to any disclaimer, the term of this patent is extended or adjusted under 35 U.S.C. 154(b) by 0 days.

(21) Appl. No.: 18/771,436

(22) Filed: Jul. 12, 2024

(65) Prior Publication Data

US 2026/0017185 A1     Jan. 15, 2026

Related U.S. Application Data

(60) Provisional application No. 63/539,225, filed on Sep. 19, 2023.

(51) Int. Cl.
*G11C 16/34*          (2006.01)
(52) U.S. Cl.
CPC ................................. *G11C 16/3431* (2013.01)
(58) Field of Classification Search
None
See application file for complete search history.

(56) References Cited

U.S. PATENT DOCUMENTS

| | | | | |
|---|---|---|---|---|
| 11,676,671 B1 * | 6/2023 | Aiouaz | ................... | G11C 16/28 |
| | | | | 365/15 |
| 2009/0323412 A1 * | 12/2009 | Mokhlesi | ............ | G11C 11/5642 |
| | | | | 365/185.02 |

| | | | | |
|---|---|---|---|---|
| 2014/0173172 A1 * | 6/2014 | Yang | .................... | G11C 29/021 |
| | | | | 711/102 |
| 2014/0229131 A1 * | 8/2014 | Cohen | ................ | G11C 16/3418 |
| | | | | 702/64 |
| 2016/0118132 A1 * | 4/2016 | Prins | ..................... | G06F 11/076 |
| | | | | 714/704 |
| 2016/0179406 A1 * | 6/2016 | Gorobets | .............. | G06F 11/079 |
| | | | | 711/103 |
| 2017/0263310 A1 * | 9/2017 | Hung | .................... | G06F 11/108 |
| 2019/0348124 A1 * | 11/2019 | Kim | ........................ | G11C 29/52 |
| 2020/0211662 A1 * | 7/2020 | Cariello | ................ | G06F 3/0679 |
| 2021/0263679 A1 * | 8/2021 | Gunderson | ............ | G06F 3/064 |
| 2022/0189572 A1 * | 6/2022 | Rayaprolu | .......... | G11C 11/5642 |

OTHER PUBLICATIONS

Micheloni et al. Inside Solid State Drives (SSDs). 2018. Springer. 2nd ed. pp. 71-72.*

* cited by examiner

*Primary Examiner* — Nathan Sadler
(74) *Attorney, Agent, or Firm* — Holland & Hart LLP

(57)                    ABSTRACT

Methods, systems, and devices for read disturb detection in a memory system are described. A memory system may perform a read operation on a set of memory cells using a read voltage that is between a first target threshold voltage for the set of memory cells and a second target threshold voltage for the set of memory cells. The memory system may determine, based on a quantity of memory cells with a threshold voltage greater than the read voltage being greater than a threshold quantity, a bit error rate for the set of memory cells. And the memory system may determine whether to perform a refresh operation on the set of memory cells based on the bit error rate for the set of memory cells.

21 Claims, 5 Drawing Sheets

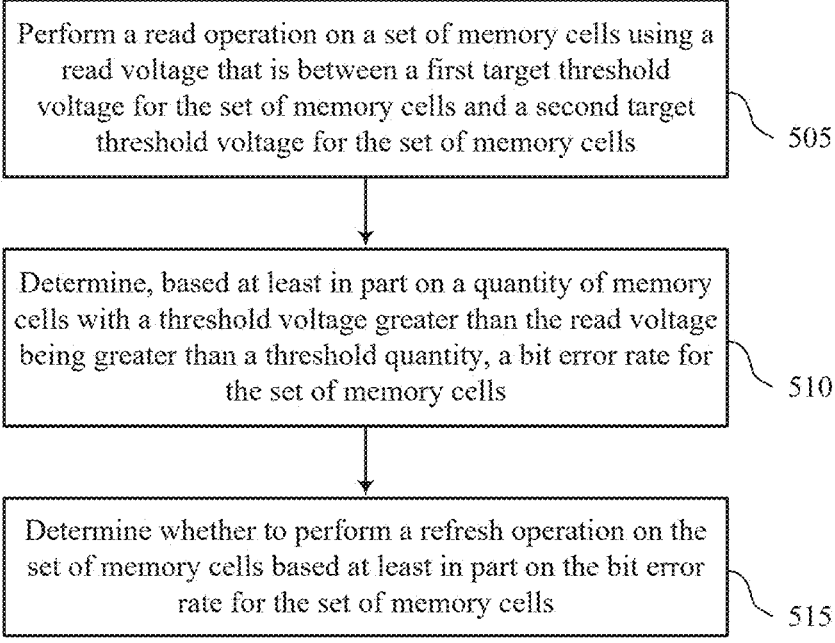

Perform a read operation on a set of memory cells using a read voltage that is between a first target threshold voltage for the set of memory cells and a second target threshold voltage for the set of memory cells

505

Determine, based at least in part on a quantity of memory cells with a threshold voltage greater than the read voltage being greater than a threshold quantity, a bit error rate for the set of memory cells

510

Determine whether to perform a refresh operation on the set of memory cells based at least in part on the bit error rate for the set of memory cells

READ DISTURB DETECTION IN A MEMORY SYSTEM

CROSS REFERENCE

The present Application for Patent claims priority to U.S. Patent Application No. 63/539,225 by He et al., entitled "READ DISTURB DETECTION IN A MEMORY SYSTEM," filed Sep. 19, 2023, which is assigned to the assignee hereof, and which is expressly incorporated by reference in its entirety herein.

TECHNICAL FIELD

The following relates to one or more systems for memory, including read disturb detection in a memory system.

BACKGROUND

Memory devices are widely used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, the memory device may read (e.g., sense, detect, retrieve, determine) states from the memory cells. To store information, the memory device may write (e.g., program, set, assign) states to the memory cells.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states if disconnected from an external power source.

BRIEF DESCRIPTION OF THE DRAWINGS

FIG. 5 illustrates a flowchart showing a method or methods that support read disturb detection in a memory system in accordance with examples as disclosed herein.

DETAILED DESCRIPTION

A memory system may use respective threshold voltages of memory cells to store information. For example, the memory system may, via a write operation, set the threshold voltages of memory cells to a set of target levels each of which may represent a different logic value. However, read operations on one set of memory cells may disturb (e.g., change, influence, weaken) the threshold voltages of a neighboring set of memory cells, a phenomenon that may be referred to as read disturb. A memory system may attempt to determine whether a set of memory cells is affected by read disturb based on the bit error rate for that set of memory cells. But determining the bit error rate for the set of memory cells may be a time-consuming process and, without additional information, may result in false detection of read disturb (e.g., a false positive), which in turn may cause the memory system to waste resources in unnecessary remedial measures, among other challenges.

According to the techniques described herein, a memory system may improve read disturb detection by evaluating a distribution of memory cells with threshold voltages relative to, such as above, a read voltage that differentiates a given target threshold voltage, such as a lowest target threshold voltage, which may be most susceptible to read disturb. For example, for a given set of memory cells, the memory system may determine the quantity of memory cells with threshold voltages above the read voltage and compare that quantity with (e.g., relative to) a threshold quantity (e.g., a quantity expected in the absence of no read disturb). If the quantity of memory cells is greater than or equal to the threshold quantity (indicating that the lowest distribution has spread due to read disturb), the memory system may then analyze the bit error rate for the set of memory cells to determine whether the set of memory cells is suffering from read disturb. Otherwise, if the quantity of memory cells is less than the threshold quantity, the memory system may determine that the set of memory cells is not subject to a level of (e.g., free of, limited) read disturb and may avoid analyzing, or computing, the bit error rate.

Figure 1:
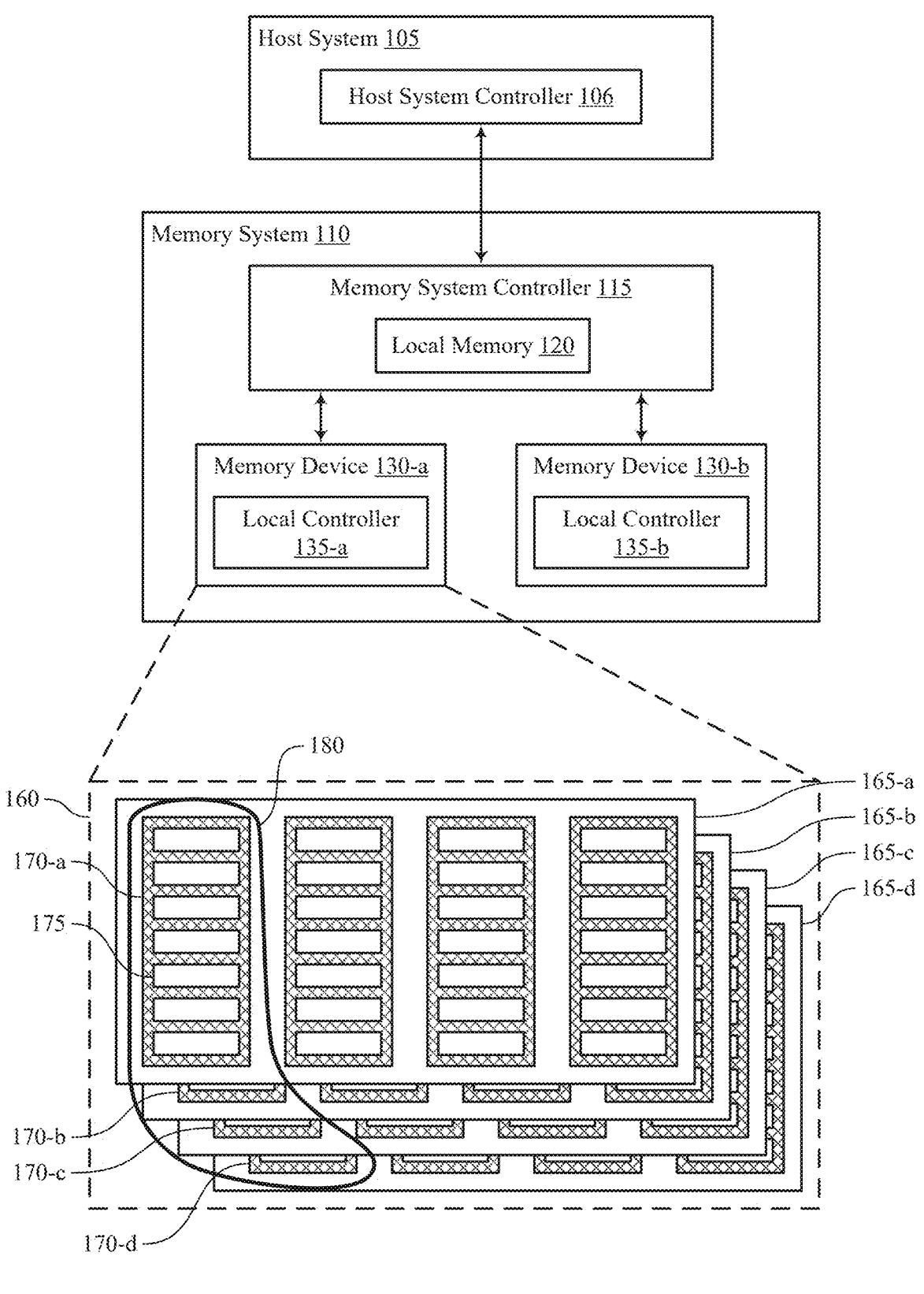
FIG. 1 illustrates an example of a system that supports read disturb detection in a memory system in accordance with examples as disclosed herein.

Features of the disclosure are initially described in the context of systems, devices, and circuits with reference to FIG. 1. Features of the disclosure are described in the context of threshold voltage distributions and a process flow with reference to FIGS. 2 through 3. These and other features of the disclosure are further illustrated by and described in the context of an apparatus diagram and flowchart that relate to read disturb detection in a memory system with reference to FIGS. 4 through 5.

FIG. 1 illustrates an example of a system 100 that supports read disturb detection in a memory system in accordance with examples as disclosed herein. The system 100 includes a host system 105 coupled with a memory system 110. The system 100 may be included in a computing device such as a desktop computer, a laptop computer, a network server, a mobile device, a vehicle (e.g., airplane, drone, train, automobile, or other conveyance), an Internet of Things (IOT) enabled device, an embedded computer (e.g., one included in a vehicle, industrial equipment, or a networked commercial device), or any other computing device that includes memory and a processing device.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB)

flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other devices.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

In some examples, the memory system controller 115 may facilitate a read disturb detection procedure that has reduced latency and false detection rates relative to other read disturb detection procedures. In such examples, the local controllers 135 may facilitate the read disturb detection procedure by controlling memory device-specific operations, such as access (e.g., read operations), that are associated with the read disturb detection procedure.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hardcoded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally, or alternatively, include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a die 160 (e.g., a memory die). For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170 and, in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at a page level of granularity, or portion thereof) but may be erased at a second level of granularity (e.g., at a block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

The system 100 may include any quantity of non-transitory computer readable media that support read disturb detection in a memory system. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

To write a logic value (e.g., a single-bit value or a multi-bit value) to a memory cell, the memory system 110 may bias the access lines of the memory cell so that the threshold voltage of the memory cell is set to a target level corresponding to that logic value. In general, $2^n$ levels may be used to store n bits in a memory cell. So, a single level cell (SLC) may use two levels to store one bit, a multi-level cell (MLC) may use four levels to store two bits, a tri-level cell (TLC) may use eight levels to store three bits, and a quad-level cell may use 16 levels to store four bits. To read the logic value of a memory cell, the memory system 110 may compare the threshold voltage of the memory cell with one or more read voltages associated with the different logic values supported by the memory system 110. Comparing the threshold voltage of a memory cell with a read voltage may involve applying the read voltage to the memory cell to see if current flows in response to the applied read voltage.

Across a set (e.g., a page) of memory cells, the threshold voltage (Vt) of memory cells written with the same logic value may vary, resulting in a distribution of threshold voltages (collectively referred to as a Vt distribution) that are clustered around the target level for that logic value. Over time, the memory cells may suffer from various phenomenon that distort or shift the Vt distributions, which in turn may result in read errors. For example, the memory cells may suffer from Vt drift (also referred to as slow charge loss) or some other phenomenon that causes the threshold voltages to shift downward (e.g., decrease). The memory cells may also suffer from read disturb in that the read operations performed on one set of memory cells may cause the threshold voltages of neighboring cells to change. Vt drift may be particularly pronounced, in some examples, for higher threshold voltages and read disturb may be particularly pronounced for lower threshold voltages.

A memory system may be configured to compensate for read disturb by refreshing (e.g., re-writing) the data in a set of memory cells. To avoid refreshing a set of memory cells unnecessarily, the memory system may wait to detect read disturb before performing a refresh operation on the set of memory cells. But other different techniques for detecting read disturb may have high latency, or high false detection rates, or both, which may impair the performance of the memory system 110.

Using the techniques described herein, the memory system 110 may implement a read disturb detection procedure that has reduced latency and false detection rates relative to other read disturb detection procedures. As part of the read disturb detection procedure for a set of memory cells, the memory system 110 may A) determine the quantity of memory cells with Vt levels above a read voltage associated with the lowest Vt distribution, and B) compare the quantity with a threshold quantity. If the quantity of memory cells is greater than or equal to the threshold quantity, the memory system 110 may proceed to another step of the read disturb detection operation that involves the bit error rate. If the quantity of memory cells is less than the threshold quantity, the memory system 110 may determine that the set of cells is not subject to a level of (e.g., free of, limited) read disturb and terminate the read disturb detection procedure before involving the bit error rate.

In addition to applicability in memory systems as described herein, the techniques for detecting read disturb described herein may be generally implemented to improve the performance of various electronic devices and systems. Some electronic device applications, including gaming and other high-performance applications, may be associated with relatively high processing requirements while also benefitting from relatively quick response times to improve user experience. As such, increasing processing speed, decreasing response times, or otherwise improving the performance electronic devices may be desirable. Implementing the techniques described herein will improve the performance of electronic devices by decreasing the latency associated with read disturb detection, which in turn will decrease processing or latency times, improve response times, and/or otherwise improve user experience, among other benefits.

Figure 2:
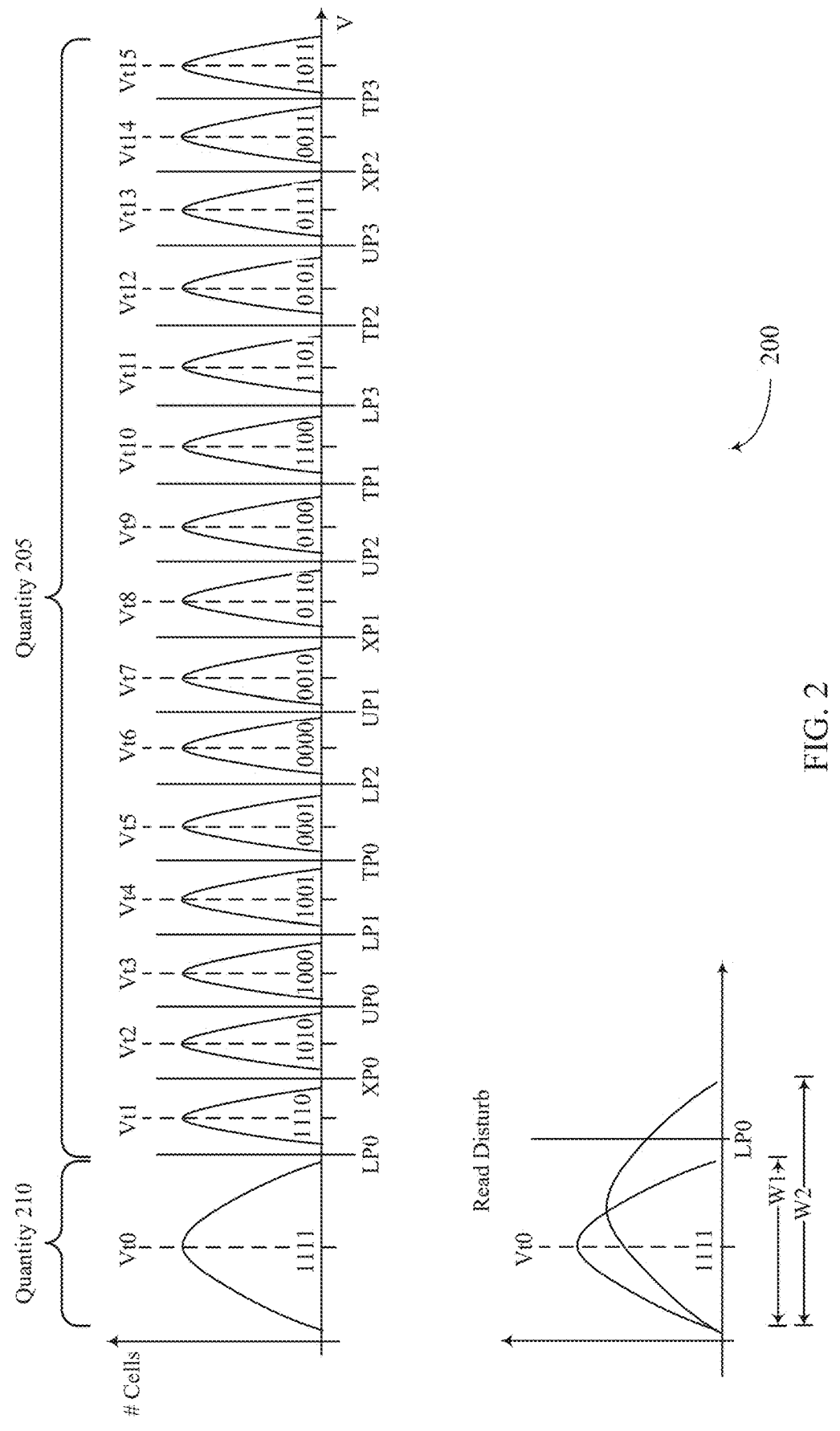
FIG. 2 illustrates an example of threshold voltage distributions that support read disturb detection in a memory system in accordance with examples as disclosed herein.

FIG. 2 illustrates an example of Vt distributions 200 that supports read disturb detection in a memory system in accordance with examples as disclosed herein. The Vt distributions 200 may be examples of Vt distributions for QLCs, where a QLC refers to a memory cell that is configured to store four bits using one of sixteen target Vt levels supported by the memory system. So, the Vt distributions 200 may include sixteen Vt distributions for sixteen target Vt levels (labeled Vt0 through Vt15), each target Vt level of which may represent or be associated with a respective multi-bit value. For example, Vt0 may represent logic value 1111, Vt1 may represent logic value 1110, and so on and so forth as illustrated in FIG. 2. The Vt distribution for a target Vt level may be generally centered around the target Vt level and may indicate the quantities of memory cells with various Vt levels. The Vt distribution for a target Vt level may be generally centered around the target Vt level and may represent the quantities of memory cells with various Vt levels.

Although described with reference to QLCs, the techniques described herein can be implemented using any type of threshold-voltage based memory cell, including SLCs that are configured to store a single bit using two threshold voltage levels, MLCs that are configured to store two bits using four threshold voltages, and TLCs that are configured to store three bits using eight threshold voltage levels.

The Vt distributions 200 may include the threshold voltages of memory cells in a physical page (or other granularity of memory cells) and the bits associated with the threshold voltages may represent data from multiple logical pages associated with the physical page. For example, in the QLC context, a physical page may be viewed as four stacked logical pages: a lower page (LP), an upper page (UP), an extra page (XP), and a top page (TP). In such an example, the least significant bits of a physical page may represent the bits of the lower page, the second least significant bits may represent the bits of the upper page, the second most significant bits may represent the bits of the extra page, and the most significant bits may represent the bits of the top page.

To read the bits of a logical page, the memory system may apply a series of read voltages associated with that logical page. For instance, to read the bits of the lower page (which are represented by the least significant bits stored by the memory cells), the memory system may apply read voltages LP0 through LP3. To read the bits of the upper page (which are represented by the second least significant bits stored by the memory cells), the memory system may apply read voltages UP0 through UP3. To read the bits of the extra page (which are represented by the second most significant bits stored by the memory cells), the memory system may apply read voltages XP0 through XP2. And to read the bits of the top page (which are represented by the most significant bits stored by the memory cells), the memory system may apply read voltages TP0 through TP3. In general, the read voltages may be more or less centered between adjacent target Vt levels.

The set of memory cells (e.g., the physical page) represented by the Vt distributions 200 may be susceptible to various phenomenon that shift or otherwise alter the Vt distributions. For instance, over time the Vt distributions may shift left due to Vt drift. Accordingly, the read voltages used to read the memory cells may become inaccurate, which may reduce the ability of the memory system to reliably distinguish between logic values during read operations (resulting in read errors). The amount of Vt drift experienced by a memory cell may vary with the target Vt level (with higher target Vt levels experiencing more Vt drift).

Additionally or alternatively, the set of memory cells may experience read disturb that causes the width of the of the Vt distributions to increase. For example, as shown in the lower illustration of FIG. 2, the Vt distribution for target Vt level 0 (Vt0) may expand from width W1 to width W2, indicating that the Vt levels of multiple memory cells written to '1111' have increased. The severity of width increase due to read disturb may vary with the target Vt level (with lower target Vt levels experiencing more significant increases). For instance, memory cells belonging to the Vt distribution for the lowest target Vt level (e.g., Vt0) may experience the most severe read disturb effects, which may cause some of the memory cells to cross over the lowest read voltage (e.g., LP0) and be erroneously interpreted as belonging to the Vt distribution for the second lowest target Vt level (e.g., Vt1).

According to the techniques described herein, the memory system may detect if a set of memory cells has experienced read disturb (or a threshold level of read disturb) by counting the quantity of memory cells (quantity 205) with Vt levels greater than read voltage LP0. To do so, the memory system may perform a lower page read by applying the read voltages LP0 through LP3 to the set of memory cells, reading the raw data from the set of memory cells, and summing the memory cells with Vt levels above LP0. The read voltage LP1 may also be referred to as the lowest read voltage, the read voltage for differentiating between the lowest Vt distribution and the second lowest Vt distribution, or the read voltage between Vt0 and Vt1, among other suitable terms. In some examples, the process of reading the set of memory cells and determining the quantity 205 may be referred to as a Coarse Threshold Estimate (CTE) read operation.

After determining the quantity 205, the memory system may compare the quantity with a threshold quantity to determine the likelihood that the set of memory cells has experienced read disturb (or a threshold level of read disturb). For instance, the memory system may compare the quantity 205 with a threshold quantity Rd_Thld, which may be the expected quantity of memory cells with Vt levels above read voltage LP0 before the set of memory cells experiences read disturb. For example, if the memory system employs data scrambling during writing so that the Vt distributions 200 are roughly equal, the threshold quantity Rd_Thld may be based on (e.g., a function of) the quantity of Vt distributions. As an illustration in the QLC context, the threshold quantity Rd_Thld may be equal to $^{15}\!/_{16}$ (e.g., ~94%) of the total number of memory cells in the set of memory cells, where 16 is the number of Vt distributions and 15 is the number of Vt distributions with Vt levels above read voltage LP0).

If the quantity 205 is less than or equal to the threshold quantity Rd_Thld, the memory system may determine that the set of memory cells has a low likelihood of having experienced read disturb and may end the read disturb detection procedure. By using the quantity 205 as a threshold condition for proceeding with the read disturb detection procedure, the memory system may avoid determining the bit error rate for the set of memory cells, which may be a time-consuming process that involves sending the raw data from the set of memory cells to a decoder for error detection. Use of the quantity 205 as a threshold condition may also allow the memory system to avoid false positives (e.g., erroneous detection of read disturb) that may otherwise occur if a high bit error rate is due to another phenomenon, such as Vt drift.

If the quantity 205 is greater than or equal to the threshold quantity Rd_Thld, the memory system may determine that the set of memory cells has a risk (e.g., a likelihood) of having experienced read disturb (e.g., because the quantity 205 exceeding the threshold quantity Rd_Thld may be the result of some of the memory cells in the Vt0 distribution having moved to the VT1 distribution). In such a scenario, the memory system may proceed with the read disturb detection procedure and determine the bit error rate for the set of memory cells (e.g., using the raw data from reading the set of memory cells).

Although described with reference to the quantity 205, the error detection procedure may involve the use of a different quantity, such as the quantity 210, which may be the quantity of memory cells with Vt levels less than the read voltage LP0. In such an example, the quantity 210 may be compare to a threshold quantity that is equal to the total number of memory cells in the set of memory cells minus the threshold quantity Rd_Thld. Further, the memory system may determine that the set of memory cells is at risk of having experienced read disturb if the quantity 210 is less than or equal to the threshold quantity and may determine that the set of memory cells is not at risk of having experienced read disturb if the quantity 210 is greater than or equal to the threshold quantity.

If the bit error rate is less than or equal to a threshold bit error rate BER_Thld, the memory system may determine that the set of memory cells has a low likelihood of having experienced read disturb and may end the read disturb detection procedure. If the bit error rate is less than or equal to a threshold bit error rate BER_Thld, the memory system may determine that the set of memory cells has a high likelihood of having experienced read disturb and may either A) perform a refresh operation on the set of memory cells to compensate for the read disturb or B) proceed with the read disturb detection procedure to verify that the bit error rate is due to read disturb and not another phenomenon, such as Vt drift.

In some examples, the memory system may initiate a read disturb detection procedure based on (e.g., in response to) detecting satisfaction of a trigger condition. For example, the memory system may initiate a read disturb detection procedure for a set of memory cells based on (e.g., in response to) determining that a threshold quantity of read operations has been performed on the set of memory cells. The threshold quantity may be based on (e.g., a function of) the quantity of programming and erase cycles (PECs) performed on the set of memory cells, the type of memory cells in the set of memory cells (e.g., MLC versus QLC), or both, among other metrics.

As another example, the memory system may take a probabilistic approach and initiate a read disturb detection procedures for a set of memory cells based on (e.g., in response to) determining that a threshold quantity of read commands have been received (e.g., for a superset of memory cells that includes the set of memory cells). Use of received read commands as a trigger condition may be associated with reduced overhead relative to use of other metrics (e.g., quantity of performed read operations). For example, the memory system may maintain a single counter for read commands received for the superset of memory cells rather than respective counters for read operations performed on different sets of memory cells.

Thus, the memory system may perform a read disturb detection procedure using the quantity 205 and the bit error rate. As noted, indiscriminate use of the bit error rate, without first checking the quantity 205, may result in unnecessary, time-consuming bit error rate calculations and/or a high rate of false positives in detecting read disturb. So, use of a read disturb detection procedure that uses quantity 205, as described herein, may reduce the latency and rate of false positives relative to other read disturb detection techniques.

Figure 3:
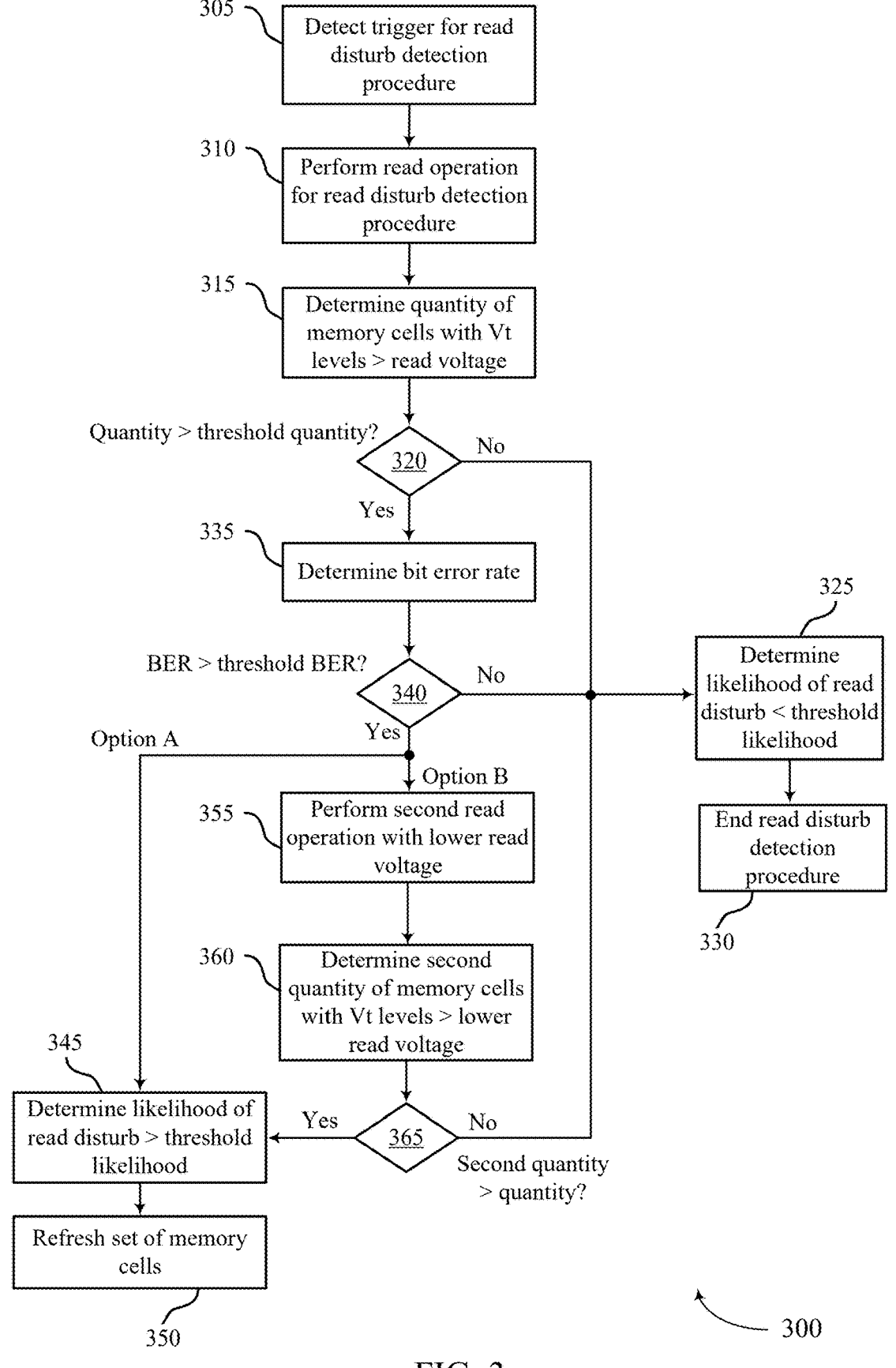
FIG. 3 illustrates an example of a process flow that supports read disturb detection in a memory system in accordance with examples as disclosed herein.

FIG. 3 illustrates an example of a process flow 300 that supports read disturb detection in a memory system in accordance with examples as disclosed herein. The process flow 300 may be implemented by a memory system such as the memory system 110 or the memory system as described with reference to FIGS. 1 and 2, respectively. The process flow 300 may illustrate operations of a memory system that implements the read disturb detection techniques described herein. For example, process flow 300 may illustrate the operations of a memory system that performs a read detection operation for a set of memory cells with Vt distributions as described in FIG. 2.

Aspects of the process flow 300 may be implemented by a controller, among other components. Additionally or alternatively, aspects of the process flow 300 may be implemented as instructions stored in memory (e.g., firmware stored in a memory coupled with a memory system). For example, the instructions, if executed by a controller (e.g., the memory system controller 115, a local controller 135), may cause the controller to perform the operations of the process flow 300.

At 305, a condition for triggering a read disturb detection procedure for a set of memory cells (e.g., one or more pages) may be detected. For example, the memory system (e.g., memory system 110) may determine that a threshold quantity of read operations have been performed on the set of memory cells. Alternatively, the memory system may determine that a threshold quantity of read commands have been received for the set of memory cells or a superset of memory cells (e.g., a block, a memory die) that includes the set of memory cells.

At 310, a read operation for the read disturb detection procedure may be performed. For example, the memory system (e.g., memory system 110) may perform a lower page read operation on the set of memory cells based on (e.g., in response to) detecting the condition to trigger the read disturb detection procedure. The memory system may perform the read operation using one or more read voltages associated with the lower page, such as read voltage LP0. As part of the read operation, the memory system may determine the raw data stored by the set of memory cells for the lower page. At 315, the quantity of memory cells with threshold voltage levels greater than the read voltage may be determined. For example, the memory system may determine the quantity of memory cells with threshold voltage levels greater than read voltage LP0. In some examples, the operations at 310 and 315 may be part of a CTE read as described herein.

At 320, it may be determined whether the quantity of memory cells (with threshold voltages greater than the read voltage) satisfies (e.g., is greater than or equal to) a threshold quantity. For example, the memory system (e.g., memory system 110) may determine whether the quantity of memory cells (with threshold voltages greater than the read voltage LP0) satisfies (e.g., is greater than or equal to) the threshold quantity Rd_Thld. The memory system may make the determination at 320 by comparing the quantity of memory cells with the threshold quantity.

If, at 320, it is determined that the quantity of memory cells does not satisfy (e.g., is less than or equal to) the threshold quantity, the memory system (e.g., memory system 110) may proceed to 325 and determine that the likelihood of read disturb is less than a threshold likelihood. Accordingly, at 330, the memory system (e.g., memory system 110) may refrain from performing a refresh operation on the set of memory cells and the read disturb detection procedure may be ended. For example, the memory system may refrain from calculating the bit error rate for the set of memory cells. Determining the bit error rate may be a resource-consumptive process, so avoiding the bit error rate determination (e.g., by checking the quantity of memory cells against the threshold quantity to exit the read disturb detection procedure at 330) may reduce the unnecessary use of resources used to determine the bit error rate.

If, at 320, it is determined that the quantity of memory cells satisfies (e.g., is greater than or equal to) the threshold quantity, the memory system (e.g., memory system 110) may proceed to 335. At 335, the bit error rate (BER) for the set of memory cells may be determined. For example, the memory system (e.g., memory system 110) may transfer the raw data from the read operation to a decoder for decoding and error detection.

At 340, it may be determined whether the bit error rate for the set of memory cells satisfies (e.g., is greater than or equal to) a threshold bit error rate. For example, the memory system (e.g., memory system 110) may determine whether the bit error rate for the set of memory cells satisfies the threshold bit error rate BER_Thld.

If, at 340, it is determined (e.g., by the memory system) that the bit error rate does not satisfy the threshold bit error rate, the memory system (e.g., memory system 110) may proceed to 325 and determine that the likelihood of read disturb is less than a threshold likelihood. Accordingly, at 330, the memory system (e.g., memory system 110) may refrain from performing a refresh operation on the set of memory cells and the read disturb detection procedure may be terminated.

If, at 340, it is determined (e.g., by the memory system) that the bit error rate satisfies the threshold bit error rate, the memory system (e.g., memory system 110) may proceed according to Option A or Option B. At 345, it may be determined (e.g., by the memory system such as memory system 110) that the likelihood of read disturb is greater than or equal to a threshold likelihood. Accordingly, at 350, a refresh operation may be performed on the set of memory cells. A refresh operation may involve re-writing the data in the set of memory cells to the set of memory cells or a second set of memory cells.

In Option B, if it is determined at 340 that the bit error rate satisfies the threshold bit error rate, the memory system (e.g., memory system 110) may proceed to 355. At 355, a second read operation may be performed on the set of memory cells using a lower read voltage. For example, the memory system (e.g., memory system 110) may perform the second read operation based on (e.g., in response to) the bit error rate satisfying the threshold bit error rate. The lower read voltage may be referred to as read voltage LP0' and may be lower (e.g., less) than read voltage LP0.

At 360, a second quantity of memory cells with threshold voltage levels above the lower read voltage may be determined. For example, the memory system (e.g., memory system 110) may determine the second quantity of memory cells with threshold voltage levels above read voltage LP0'. If the second quantity is greater than the quantity determined at 315 (meaning that some cells not included in the quantity at 315 were included in the second quantity at 360), the memory system may determine that read disturb has contributed to the high bit error rate. If the second quantity is equal to the quantity determined at 315 (meaning that the cells included in the quantity at 315 were also included in the second quantity at 360), the memory system may determine that the high bit error rate is due primarily to a phenomenon other than read disturb, such as threshold drift. So, by lowering the read voltage and determining the second quantity of memory cells, the memory system may distinguish between high bit error rates that are based on (e.g., due to) read disturb and high bit error rates that are based on (e.g., due to) Vt drift.

At 365, it may be determined whether the second quantity is greater than the quantity determined at 315. If, at 365, it is determined that the second quantity is not greater than the quantity, the memory system (e.g., memory system 110) may proceed to 325 and determine that the likelihood of read disturb is less than a threshold likelihood. Accordingly, at 330, the memory system (e.g., memory system 110) may refrain from performing a refresh operation on the set of memory cells and the read disturb detection procedure may be concluded. If, at 365, it is determined that the second quantity is greater than the quantity, the memory system may proceed to 345 and determine that the likelihood of read disturb is greater than or equal to a threshold likelihood. Accordingly, at 350, a refresh operation may be performed on the set of memory cells.

Thus, the memory system (e.g., memory system 110) may perform a read disturb detection procedure as described herein, which may improve the performance of the memory system. Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 4:
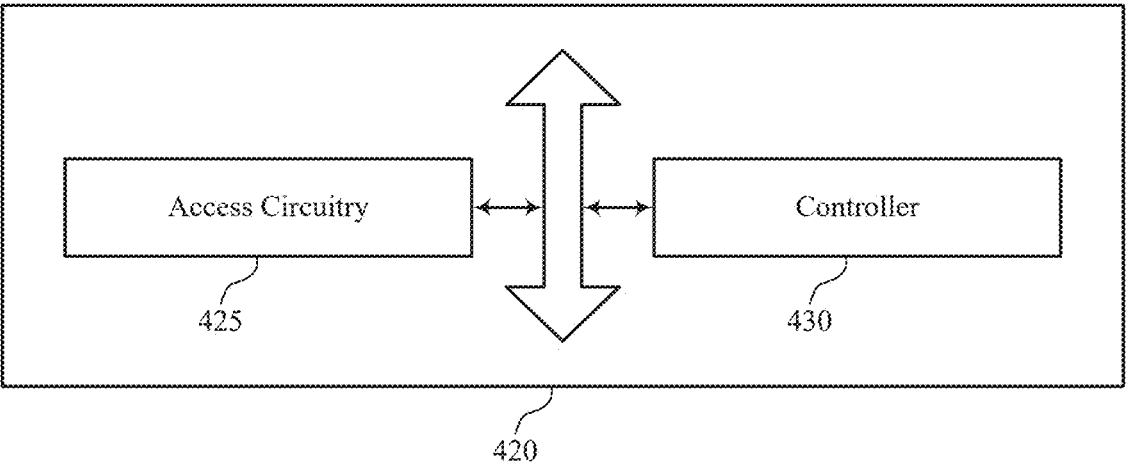
FIG. 4 illustrates a block diagram of a memory system that supports read disturb detection in a memory system in accordance with examples as disclosed herein.

FIG. 4 illustrates a block diagram 400 of a memory system 420 that supports read disturb detection in a memory system in accordance with examples as disclosed herein. The memory system 420 may be an example of aspects of a memory system as described with reference to FIGS. 1 through 3, such as memory system 110. The memory system 420, or various components thereof, may be an example of means for performing various aspects of read disturb detection in a memory system as described herein. For example, the memory system 420 may include access circuitry 425, a controller 430, or any combination thereof. Each of these components may communicate, directly or indirectly, with one another (e.g., via one or more buses).

The access circuitry 425 may be configured as or otherwise support a means for performing a read operation on a set of memory cells using a read voltage that is between a first target threshold voltage for the set of memory cells and a second target threshold voltage for the set of memory cells. The controller 430 may be configured as or otherwise support a means for determining, based at least in part on a quantity of memory cells with a threshold voltage greater than the read voltage being greater than a threshold quantity, a bit error rate for the set of memory cells. In some examples, the controller 430 may be configured as or otherwise support a means for determining whether to perform a refresh operation on the set of memory cells based at least in part on the bit error rate for the set of memory cells.

In some examples, the first target threshold voltage includes a lowest target threshold voltage for the set of memory cells and the second target threshold voltage includes a second lowest target threshold voltage for the set of memory cells.

In some examples, the access circuitry 425 may be configured as or otherwise support a means for performing the refresh operation based at least in part on the bit error rate for the set of memory cells being greater than or equal to a threshold bit error rate.

In some examples, the controller 430 may be configured as or otherwise support a means for refraining from performing the refresh operation based at least in part on the bit error rate for the set of memory cells being less than or equal to a threshold bit error rate.

In some examples, the controller 430 may be configured as or otherwise support a means for determining the quantity of memory cells with the threshold voltage greater than the read voltage based at least in part on performing the read operation.

In some examples, the access circuitry 425 may be configured as or otherwise support a means for performing, based at least in part on the bit error rate being greater than or equal to a threshold bit error rate, a second read operation on the set of memory cells using a second read voltage that is lower than the read voltage. In some examples, the controller 430 may be configured as or otherwise support a means for determining a second quantity of memory cells with a threshold voltage greater than the second read voltage based at least in part on performing the second read operation, where determining whether to perform the refresh operation on the set of memory cells is based at least in part on the quantity and the second quantity.

In some examples, the access circuitry 425 may be configured as or otherwise support a means for performing the refresh operation based at least in part on the second quantity being greater than the quantity.

In some examples, the access circuitry 425 may be configured as or otherwise support a means for refraining from performing the refresh operation based at least in part on the second quantity being less than or equal to the quantity.

In some examples, the controller 430 may be configured as or otherwise support a means for determining that a quantity of received read commands is greater than or equal to a second threshold quantity of read commands, where the read operation is performed based at least in part on the quantity of received read commands being greater than or equal to the second threshold quantity.

In some examples, the controller 430 may be configured as or otherwise support a means for determining that a quantity of read operations performed on the set of memory cells is greater than or equal to a second threshold quantity of read operations, where the read operation is performed based at least in part on the quantity of read operations being greater than or equal to the second threshold quantity.

FIG. 5 illustrates a flowchart showing a method 500 that supports read disturb detection in a memory system in accordance with examples as disclosed herein. The operations of method 500 may be implemented by a memory system or its components as described herein. For example, the operations of method 500 may be performed by a memory system as described with reference to FIGS. 1 through 4. In some examples, a memory system may execute a set of instructions to control the functional elements of the device to perform the described functions. Additionally, or alternatively, the memory system may perform aspects of the described functions using special-purpose hardware.

At 505, the method may include performing a read operation on a set of memory cells using a read voltage that is between a first target threshold voltage for the set of memory cells and a second target threshold voltage for the set of memory cells. The operations of 505 may be performed in accordance with examples as disclosed herein. In some examples, aspects of the operations of 505 may be performed by an access circuitry 425 as described with reference to FIG. 4.

At 510, the method may include determining, based at least in part on a quantity of memory cells with a threshold voltage greater than the read voltage being greater than a threshold quantity, a bit error rate for the set of memory cells. The operations of 510 may be performed in accordance with examples as disclosed herein. In some examples, aspects of the operations of 510 may be performed by a controller 430 as described with reference to FIG. 4.

At 515, the method may include determining whether to perform a refresh operation on the set of memory cells based at least in part on the bit error rate for the set of memory cells. The operations of 515 may be performed in accordance with examples as disclosed herein. In some examples, aspects of the operations of 515 may be performed by a controller 430 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for performing a read operation on a set of memory cells using a read voltage that is between a first target threshold voltage for the set of memory cells and a second target threshold voltage for the set of memory cells; determining, based at least in part on a quantity of memory cells with a threshold voltage greater than the read voltage being greater than a threshold quantity, a bit error rate for the set of memory cells; and determining whether to perform a refresh operation on the set of memory cells based at least in part on the bit error rate for the set of memory cells.

Aspect 2: The method, apparatus, or non-transitory computer-readable medium of aspect 1, where the first target threshold voltage includes a lowest target threshold voltage for the set of memory cells and the second target threshold voltage includes a second lowest target threshold voltage for the set of memory cells.

Aspect 3: The method, apparatus, or non-transitory computer-readable medium of any of aspects 1 through 2, further including operations, features, circuitry, logic, means, or instructions, or any combination thereof for performing the refresh operation based at least in part on the bit error rate for the set of memory cells being greater than or equal to a threshold bit error rate.

Aspect 4: The method, apparatus, or non-transitory computer-readable medium of any of aspects 1 through 3, further including operations, features, circuitry, logic, means, or instructions, or any combination thereof for refraining from performing the refresh operation based at least in part on the bit error rate for the set of memory cells being less than or equal to a threshold bit error rate.

Aspect 5: The method, apparatus, or non-transitory computer-readable medium of any of aspects 1 through 4, further including operations, features, circuitry, logic, means, or instructions, or any combination thereof for determining the quantity of memory cells with the threshold voltage greater than the read voltage based at least in part on performing the read operation.

Aspect 6: The method, apparatus, or non-transitory computer-readable medium of any of aspects 1 through 5, further including operations, features, circuitry, logic, means, or instructions, or any combination thereof for performing, based at least in part on the bit error rate being greater than or equal to a threshold bit error rate, a second read operation on the set of memory cells using a second read voltage that is lower than the read voltage and determining a second quantity of memory cells with a threshold voltage greater than the second read voltage based at least in part on performing the second read operation, where determining whether to perform the refresh operation on the set of memory cells is based at least in part on the quantity and the second quantity.

Aspect 7: The method, apparatus, or non-transitory computer-readable medium of aspect 6, further including operations, features, circuitry, logic, means, or instructions, or any combination thereof for performing the refresh operation based at least in part on the second quantity being greater than the quantity.

Aspect 8: The method, apparatus, or non-transitory computer-readable medium of any of aspects 6 through 7, further including operations, features, circuitry, logic, means, or instructions, or any combination thereof for refraining from performing the refresh operation based at least in part on the second quantity being less than or equal to the quantity.

Aspect 9: The method, apparatus, or non-transitory computer-readable medium of any of aspects 1 through 8, further including operations, features, circuitry, logic, means, or instructions, or any combination thereof for determining that a quantity of received read commands is greater than or equal to a second threshold quantity of read commands, where the read operation is performed based at least in part on the quantity of received read commands being greater than or equal to the second threshold quantity.

Aspect 10: The method, apparatus, or non-transitory computer-readable medium of any of aspects 1 through 9, further including operations, features, circuitry, logic, means, or instructions, or any combination thereof for determining that a quantity of read operations performed on the set of memory cells is greater than or equal to a second threshold quantity of read operations, where the read operation is performed based at least in part on the quantity of read operations being greater than or equal to the second threshold quantity.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., "electrically coupling") may refer to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:

performing a read operation on a set of memory cells using a read voltage that is between a first target threshold voltage for the set of memory cells and a second target threshold voltage for the set of memory cells;

transferring, based at least in part on a quantity of memory cells with a threshold voltage greater than the read voltage being greater than a threshold quantity, data read from the set of memory cells to a decoder to determine a bit error rate for the set of memory cells;

performing, based at least in part on the bit error rate determined by the decoder being greater than or equal to a threshold bit error rate, a second read operation on the set of memory cells using a second read voltage that is lower than the read voltage; and determining whether to perform a refresh operation on the set of memory cells based at least in part on performing the second read operation on the set of memory cells.

2. The method of claim 1, further comprising:

performing the refresh operation based at least in part on the bit error rate for the set of memory cells being greater than or equal to the threshold bit error rate.

3. The method of claim 1, further comprising:

determining a second quantity of memory cells with a threshold voltage greater than the second read voltage based at least in part on performing the second read operation, wherein determining whether to perform the refresh operation on the set of memory cells is based at least in part on the quantity and the second quantity.

4. A non-transitory computer-readable medium storing code comprising instructions which, when executed by one or more processors of a memory system, cause the memory system to:

perform a read operation on a set of memory cells using a read voltage that is between a first target threshold voltage for the set of memory cells and a second target threshold voltage for the set of memory cells;

transfer, based at least in part on a quantity of memory cells with a threshold voltage greater than the read voltage being greater than a threshold quantity, data read from the set of memory cells to a decoder to determine a bit error rate for the set of memory cells;

perform, based at least in part on the bit error rate determined by the decoder being greater than or equal to a threshold bit error rate, a second read operation on the set of memory cells using a second read voltage that is lower than the read voltage; and determine whether to perform a refresh operation on the set of memory cells based at least in part on performing the second read operation on the set of memory cells.

5. The non-transitory computer-readable medium of claim 4, wherein the first target threshold voltage comprises a lowest target threshold voltage for the set of memory cells and the second target threshold voltage comprises a second lowest target threshold voltage for the set of memory cells.

6. The non-transitory computer-readable medium of claim 4, wherein the instructions, when executed by the one or more processors of the memory system, further cause the memory system to:

perform the refresh operation based at least in part on the bit error rate for the set of memory cells being greater than or equal to the threshold bit error rate.

7. The non-transitory computer-readable medium of claim 4, wherein the instructions, when executed by the one or more processors of the memory system, further cause the memory system to:

determine the quantity of memory cells with the threshold voltage greater than the read voltage based at least in part on performing the read operation.

8. The non-transitory computer-readable medium of claim 4, wherein the instructions, when executed by the one or more processors of the memory system, further cause the memory system to:

determine a second quantity of memory cells with a threshold voltage greater than the second read voltage based at least in part on performing the second read operation, wherein determining whether to perform the refresh operation on the set of memory cells is based at least in part on the quantity and the second quantity.

9. The non-transitory computer-readable medium of claim 8, wherein the instructions, when executed by the one or more processors of the memory system, further cause the memory system to:

perform the refresh operation based at least in part on the second quantity being greater than the quantity.

10. The non-transitory computer-readable medium of claim 8, wherein the instructions, when executed by the one or more processors of the memory system, further cause the memory system to:

refrain from performing the refresh operation based at least in part on the second quantity being less than or equal to the quantity.

11. The non-transitory computer-readable medium of claim 4, wherein the instructions, when executed by the one or more processors of the memory system, further cause the memory system to:

determine that a quantity of received read commands is greater than or equal to a second threshold quantity of read commands; and perform the read operation based at least in part on the quantity of received read commands being greater than or equal to the second threshold quantity.

12. The non-transitory computer-readable medium of claim 4, wherein the instructions, when executed by the one or more processors of the memory system, further cause the memory system to:

determine that a quantity of read operations performed on the set of memory cells is greater than or equal to a second threshold quantity of read operations; and perform the read operation based at least in part on the quantity of read operations being greater than or equal to the second threshold quantity.

13. A memory system, comprising:

one or more memory devices; and one or more controllers coupled with the one or more memory devices and configured to cause the memory system to:

perform a read operation on a set of memory cells using a read voltage that is between a first target threshold voltage for the set of memory cells and a second target threshold voltage for the set of memory cells;

transfer, based at least in part on a quantity of memory cells with a threshold voltage greater than the read voltage being greater than a threshold quantity, data read from the set of memory cells to a decoder to determine a bit error rate for the set of memory cells;

perform, based at least in part on the bit error rate determined by the decoder being greater than or equal to a threshold bit error rate, a second read operation on the set of memory cells using a second read voltage that is lower than the read voltage; and determine whether to perform a refresh operation on the set of memory cells based at least in part on performing the second read operation on the set of memory cells.

14. The memory system of claim 13, wherein the first target threshold voltage comprises a lowest target threshold voltage for the set of memory cells and the second target threshold voltage comprises a second lowest target threshold voltage for the set of memory cells.

15. The memory system of claim 13, wherein the one or more controllers are further configured to cause the memory system to:

perform the refresh operation based at least in part on the bit error rate for the set of memory cells being greater than or equal to the threshold bit error rate.

16. The memory system of claim 13, wherein the one or more controllers are further configured to cause the memory system to:

determine the quantity of memory cells with the threshold voltage greater than the read voltage based at least in part on performing the read operation.

17. The memory system of claim 13, wherein the one or more controllers are further configured to cause the memory system to:

determine a second quantity of memory cells with a threshold voltage greater than the second read voltage based at least in part on performing the second read operation, wherein determining whether to perform the refresh operation on the set of memory cells is based at least in part on the quantity and the second quantity.

18. The memory system of claim 17, wherein the one or more controllers are further configured to cause the memory system to:

perform the refresh operation based at least in part on the second quantity being greater than the quantity.

19. The memory system of claim 17, wherein the one or more controllers are further configured to cause the memory system to:

refrain from performing the refresh operation based at least in part on the second quantity being less than or equal to the quantity.

20. The memory system of claim 13, wherein the one or more controllers are further configured to cause the memory system to:

determine that a quantity of received read commands is greater than or equal to a second threshold quantity of read commands, wherein the read operation is performed based at least in part on the quantity of received read commands being greater than or equal to the second threshold quantity.

21. The memory system of claim 13, wherein the one or more controllers are further configured to cause the memory system to:

determine that a quantity of read operations performed on the set of memory cells is greater than or equal to a second threshold quantity of read operations, wherein the read operation is performed based at least in part on the quantity of read operations being greater than or equal to the second threshold quantity.

\* \* \* \* \*